United States Patent
Yeong et al.

(10) Patent No.: US 11,527,542 B2
(45) Date of Patent: Dec. 13, 2022

(54) SYSTEM-ON-CHIP WITH FERROELECTRIC RANDOM ACCESS MEMORY AND TUNABLE CAPACITOR

(71) Applicant: Taiwan Semiconductor Manufacturing Co., Ltd., Hsinchu (TW)

(72) Inventors: Sai-Hooi Yeong, Zhubei (TW); Chi On Chui, Hsinchu (TW); Chenchen Jacob Wang, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/904,717

(22) Filed: Jun. 18, 2020

(65) Prior Publication Data
US 2021/0202511 A1    Jul. 1, 2021

Related U.S. Application Data

(60) Provisional application No. 62/955,199, filed on Dec. 30, 2019.

(51) Int. Cl.
*H01L 27/11509* (2017.01)
*H01L 49/02* (2006.01)
(Continued)

(52) U.S. Cl.
CPC .. *H01L 27/11509* (2013.01); *H01L 27/10805* (2013.01); *H01L 27/10808* (2013.01);
(Continued)

(58) Field of Classification Search
CPC ......... H01L 27/10805; H01L 27/10808; H01L 27/11502; H01L 27/11507;
(Continued)

(56) References Cited

U.S. PATENT DOCUMENTS

| 6,441,415 B1* | 8/2002 | Moise | H01L 27/11502 |
| | | | 257/295 |
| 2002/0043676 A1* | 4/2002 | Ohtsuka | H01L 29/42324 |
| | | | 257/295 |

(Continued)

FOREIGN PATENT DOCUMENTS

| JP | 2008053264 A | * | 3/2008 |
| JP | 2009110622 A | * | 5/2009 |

(Continued)

OTHER PUBLICATIONS

Asad Jamil et al., "Tunable Ferroelectric Capacitor-Based Voltage-Controlled Oscillator," IEEE Transactions on Ultrasonics, Ferroelectrics, and Frequency Control, vol. 54, No. 2, Feb. 2007, 5 Pages.

*Primary Examiner* — Matthew E Warren
(74) *Attorney, Agent, or Firm* — Slater Matsil, LLP

(57) ABSTRACT

A semiconductor device includes: a substrate; a first dielectric layer over the substrate; a memory cell over the substrate in a first region of the semiconductor device, where the memory cell includes a first ferroelectric structure in the first dielectric layer, where the first ferroelectric structure includes a first bottom electrode, a first top electrode, and a first ferroelectric layer in between; and a tunable capacitor over the substrate in a second region of the semiconductor device, where the tunable capacitor includes a second ferroelectric structure, where the second ferroelectric structure includes a second bottom electrode, a second top electrode, and a second ferroelectric layer in between, where at least a portion of the second ferroelectric structure is in the first dielectric layer.

20 Claims, 21 Drawing Sheets

(51) Int. Cl.
　　　*H01L 27/11507*　　(2017.01)
　　　*H01L 27/11502*　　(2017.01)
　　　*H01L 27/108*　　　(2006.01)

(52) U.S. Cl.
　　　CPC .. *H01L 27/11502* (2013.01); *H01L 27/11507* (2013.01); *H01L 28/40* (2013.01); *H01L 28/60* (2013.01); *H01L 28/86* (2013.01)

(58) Field of Classification Search
　　　CPC ... H01L 27/11509; H01L 28/40; H01L 28/60; H01L 28/86
　　　See application file for complete search history.

(56) References Cited

U.S. PATENT DOCUMENTS

| | | | |
|---|---|---|---|
| 2004/0235245 A1 | 11/2004 | Summerfelt | |
| 2013/0062733 A1* | 3/2013 | Summerfelt | H01L 27/0805 257/532 |
| 2015/0221657 A1 | 8/2015 | Sashida | |
| 2017/0179140 A1 | 6/2017 | Ozawa et al. | |
| 2019/0148390 A1 | 5/2019 | Frank | |
| 2021/0134812 A1* | 5/2021 | Li | H01L 29/516 |
| 2021/0143071 A1* | 5/2021 | Lan | H01L 21/02013 |

FOREIGN PATENT DOCUMENTS

| | | | |
|---|---|---|---|
| KR | 20090023031 A | 3/2009 | |
| WO | WO-2019005133 A1 * | 1/2019 | H01G 7/06 |

\* cited by examiner

SYSTEM-ON-CHIP WITH FERROELECTRIC RANDOM ACCESS MEMORY AND TUNABLE CAPACITOR

CROSS-REFERENCE AND PRIORITY CLAIMS

This application claims the benefit of U.S. Provisional Application No. 62/955,199, filed on Dec. 30, 2019 and entitled "System-On-Chip (SOC) with Ferroelectric RAM and Tunable Capacitor," which application is hereby incorporated herein by reference.

TECHNICAL FIELD

The present invention relates generally to semiconductor devices, and, in particular embodiments, to semiconductor devices (e.g., System-On-Chip devices) with ferroelectric random access memories (FRAMs or FeRAMs) in a memory device region of the device and tunable capacitors (e.g., capacitors having ferroelectric film between the top and bottom electrodes of the capacitors) in a radio frequency (RF) circuit region of the device.

BACKGROUND

Semiconductor devices are used in a variety of electronic applications, such as personal computers, cell phones, digital cameras, and other electronic equipment. Semiconductor devices are typically fabricated by depositing insulating or dielectric layers, conductive layers, and semiconductor layers of material over a semiconductor substrate, and patterning the various material layers using lithography and etching techniques to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF ILLUSTRATIVE EMBODIMENTS

Figure 1:
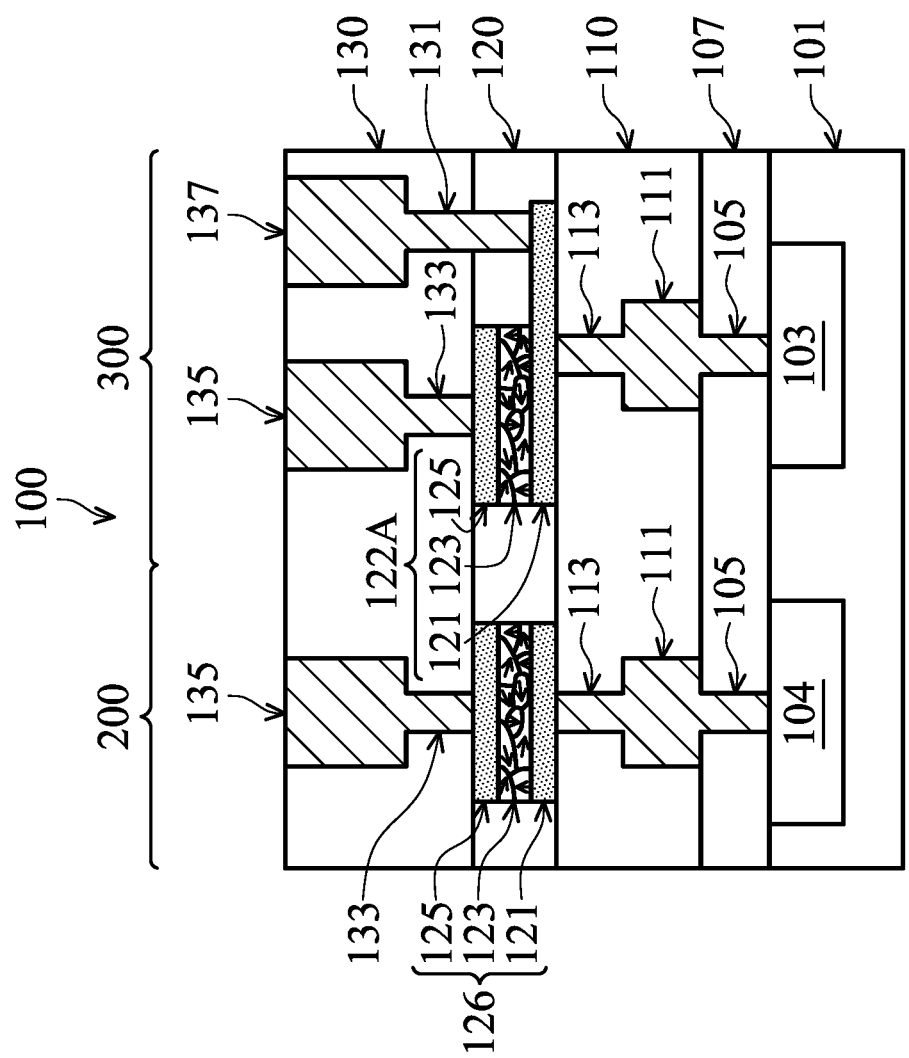
FIG. 1 illustrates a cross-sectional view of a semiconductor device having a ferroelectric random access memory (FRAM or FeRAM) cell and a tunable capacitor, in an embodiment.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Throughout the description herein, unless otherwise specified, the same reference numeral in different figures refers to the same or similar component formed by a same or similar method using a same or similar material(s).

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Ferroelectric random access memory (FRAM or FeRAM) such as embedded FeRAM is a candidate for next generation non-volatile memory due to its fast write/read speed and small size. Typically FeRAM application and RF/microwave application are treated as different applications in semiconductor manufacturing, and the devices for FeRAM memory application and RF/microwave application are fabricated separately. The application domains (e.g., memory applications and high frequency applications such as RF filters and oscillators), when using ferroelectric materials, are decoupled. As a result, products having both applications (e.g., memory and high frequency applications) and features are usually implemented in different chips (e.g., a memory chip and an RF circuit chip) that are fabricated in different processes.

In the present disclosure, the FeRAM process is used for fabrication of tunable capacitors to enable memory and high frequency functions on a same chip (e.g., a system-on-chip (SoC)) for diverse applications. In an embodiment, a ferroelectric tunable capacitor is fabricated at a same level (e.g., in a same dielectric layer over the substrate) as a ferroelectric structure of the FeRAM, but in different regions of a same chip. For example, the FeRAM is formed in a memory device region of the chip, and the tunable capacitor is formed in an RF circuit region (e.g., for high frequency applications) of the chip.

FIG. 1 illustrates a cross-sectional view of a semiconductor device 100 having a ferroelectric random access memory (FRAM or FeRAM) cell and a tunable capacitor, in an embodiment. The semiconductor device 100 may be a semiconductor die (may also be referred to as a die, or a chip) having memory devices (e.g., FeRAMs) and radio frequency (RF) circuits integrated on a same semiconductor substrate, as an example. For simplicity, FIG. 1 only illustrates a portion of the semiconductor device, and not all features of the semiconductor device 100 are illustrated in FIG. 1.

Referring to FIG. 1, the semiconductor device 100 has a plurality of electrical components (e.g., 103, 104) formed in/on a substrate 101. The electrical components 103/104 may be, e.g., transistors, although other suitable electrical components, such as resistors, capacitors, or inductors, may also be formed. The substrate 101 may be a semiconductor substrate, such as silicon, doped or undoped, or an active layer of a semiconductor-on-insulator (SOI) substrate. The substrate 101 may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

Interconnect structures are formed over the substrate 101 and the electrical components 103/104 to connect the electrical components 103/104 to form functional circuits. The interconnect structures may be formed by, e.g., forming metallization patterns in one or more dielectric layers over the substrate 101. For example, FIG. 1 illustrates dielectric layers 107/110 and conductive features 105/111/113 (e.g., vias and conductive lines) in the dielectric layers 107/110 as part of the interconnect structures. The conductive features 105/111/113 electrically couple the electrical components 103/104 to structures/circuits formed subsequently over the dielectric layer 110.

FIG. 1 illustrates a ferroelectric structure 126 in a first region 200 (may also be referred to as a first device region) of the semiconductor device 100, and a ferroelectric structure 122A in a second region 300 (may also be referred to as a second device region) of the semiconductor device 100. The first region 200 is a memory device region for forming memory devices (e.g., FRAM devices), and the second region 300 is a radio frequency (RF) circuit region for forming RF circuits (e.g., oscillators, RF filters), in the illustrated embodiment. Here RF circuits refer to circuits designed for high-frequency applications, such as RF application and/or microwave applications. In the discussion below, the ferroelectric structures (e.g., 126, 122A) may also be referred to as ferroelectric devices.

As illustrated in FIG. 1, each of the ferroelectric structures 126/122A includes a bottom electrode 121, a ferroelectric layer 123, and a top electrode 125. In the example of FIG. 1, the ferroelectric structures 126/122A are formed in a dielectric layer 120 over the substrate 101, with the upper surface of the top electrodes 125 being level with the upper surface of the dielectric layer 120, and the lower surface of the bottom electrodes 121 being level with the lower surface of the dielectric layer 120. Details regarding the materials and formation method of the semiconductor device 100 are discussed hereinafter.

The bottom electrode 121, the ferroelectric layer 123, and the top electrode 125 of the ferroelectric structure 126 have a same size (e.g., having a same dimension or surface area in a top view) such that respective sidewalls of the bottom electrode 121, respective sidewalls of the ferroelectric layer 123, and respective sidewalls of the top electrode 125 are aligned in the cross-sectional view of FIG. 1. In contrast, the top electrode 125 and the ferroelectric layer 123 of the ferroelectric structure 122A have a same size, but the bottom electrode 121 of the ferroelectric structure 122A is larger than the top electrode 125 of the ferroelectric structure 122A. In particular, in FIG. 1, the left sidewalls of the bottom electrode 121, the ferroelectric layer 123, and the top electrode 125 are aligned, but the right sidewalls of the bottom electrode 121 extends beyond lateral extents of the top electrode 125 (or lateral extents of the ferroelectric layer 123).

FIG. 1 further illustrates a dielectric layer 130 formed over the dielectric layer 120, and conductive features 131/133/135/137 (e.g., vias or conductive lines) formed in the dielectric layer 130. In the example of FIG. 1, the top electrode 125 of the ferroelectric structure 126 is electrically coupled to the conductive feature 135 (e.g., a conductive line) through the conductive feature 133 (e.g., a via), and the bottom electrode 121 of the ferroelectric structure 126 is electrically coupled to, e.g., a source/drain region of a transistor 104 through conductive features 113/111/105, thereby forming a 1T-1C memory cell, where T stands for transistor, and C stands for capacitor. In the 1T-1C memory cell, the electrical polarization direction of the ferroelectric layer 123 is set by an external electrical field to, e.g., one of two polarization directions to indicate a "0" or a "1" stored in the memory cell. The external electrical field may be generated by applying a positive or a negative voltage across the top electrode 125 and the bottom electrode 121. Therefore, in the 1T-1C memory cell, the ferroelectric structure 126 is used as a memory element for storing information, e.g., storing a bit "0" or a bit "1" by changing the electrical polarization direction of the ferroelectric layer 123. The ferroelectric electric structure 126 does not function as a tunable capacitor (e.g., a capacitor having a capacitance that is adjustable) in the memory cell.

Still referring to FIG. 1, the top electrode 125 of the ferroelectric structure 122A is electrically coupled to the conductive feature 135 (e.g., a conductive line) through the conductive feature 133 (e.g., a via). An upper surface of the bottom electrode 121 is in contact (e.g., in physical contact) with the conductive feature 131 (e.g., a via) and is electrically coupled to the conductive feature 137 (e.g., a conductive line) through the conductive feature 131. A lower surface of the bottom electrode is in contact (e.g., in physical contact) with the conductive feature 113 (e.g., a via) and is electrically coupled to the electrical component 103 (e.g., a transistor, a resistor, or an inductor) through the conductive feature 113/111/105. Note that the bottom electrode 121 of the ferroelectric structure 122A has two electrical paths, such as an upper path connected to the conductive feature 137 and a lower path connected to the electrical component 103. As will be discussed in more details below, the upper path is used for fine tuning (e.g., adjusting) the capacitance of the ferroelectric structure 122A, and the lower path is used to form an RF circuit that includes the ferroelectric structure 122A. Therefore, the ferroelectric structure 122A in the second region 300 functions as a tunable capacitor in an RF circuit, and may be referred to as a tunable capacitor 122A.

In some embodiments, the dielectric constant of the ferroelectric layer 123 exhibits a dependence on a voltage applied to the ferroelectric layer 123 and/or a frequency at which the ferroelectric layer 123 operates. Therefore, the ferroelectric structure 122A may be used as a tunable capacitor for RF/microwave applications. For example, the ferroelectric structure 122A may be used as a tunable capacitor in a voltage-controlled oscillator (VCO) circuit, or in an RF filter circuit that has an adjustable filter bandwidth. In some embodiments, the ferroelectric structure 122A is used as a tunable capacitor in an RF circuit, which RF circuit includes the electrical component 103, the ferroelectric structure 122A, and other portions of the RF circuit (see, e.g., 143 in FIG. 10). In other words, the ferroelectric structure 122A, the electrical components 103, and other portions of the RF circuit (e.g., 143 in FIG. 10) form a complete RF circuit that provides a designed RF functionality (e.g., as an oscillator circuit, or an RF filter).

In some embodiments, the ferroelectric structure 126 and the ferroelectric structure 122A are formed in a same dielectric layer (e.g., 120) of the semiconductor device 100, and are formed in a same processing step(s). In some embodiments, the corresponding layers (e.g., 121, 123, and 125) of the ferroelectric structure 126 and of the ferroelectric structure 122A are formed of a same material(s) in a same processing step.

FIGS. 2-9 illustrate cross-sectional views of a portion of the semiconductor device 100 of FIG. 1 at various stages of manufacturing, in an embodiment. In particular, FIGS. 2-9 only show the second region 300 of FIG. 1 that includes the ferroelectric structure 122A, and the first region 200 in FIG. 1 is not illustrated. One skilled in the art, upon reading the present disclosure, would readily appreciate that corresponding features in the first region 200, such as the ferroelectric structure 126, are formed in the same or similar processing steps using a same or similar material(s).

Figure 2:
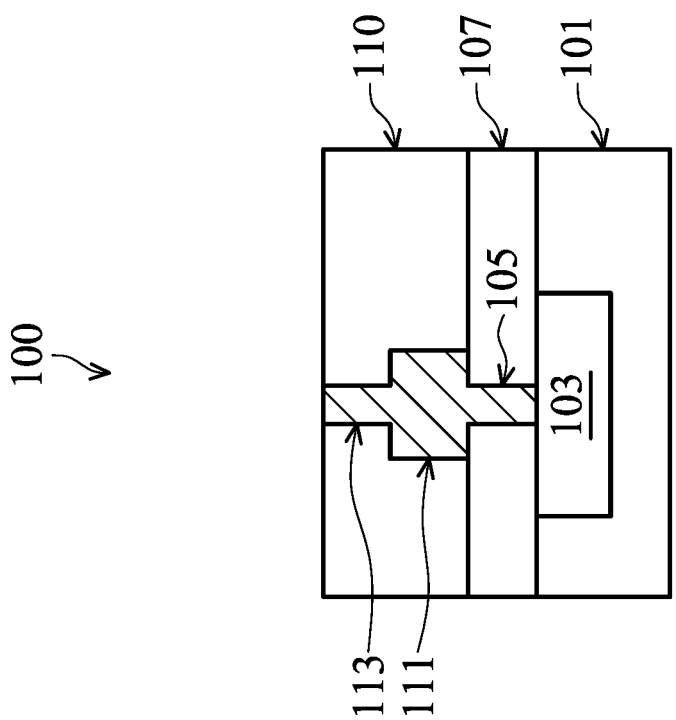
FIGS. 2-9 illustrate cross-sectional views of a portion of the semiconductor device of FIG. 1 at various stages of manufacturing, in an embodiment.

Referring now to FIG. 2, an electrical component 103, such as a transistor, a resistor, an inductor, or the like, is formed in/on the substrate 101. Dielectric layers 107 and 110, which may comprise silicon oxide, silicon nitride, or the like, are formed over the substrate 101 using suitable formation method such as chemical vapor deposition (CVD), physical vapor deposition (PVD), or the like. Conductive features 105, 111, and 113 (e.g., vias or conductive lines), which comprise electrically conductive material such as copper, aluminum, or the like, are formed in the dielectric layers 107/110 by patterning the dielectric layers 107/110 and forming the electrically conductive material in the patterns of the dielectric layers 107/110 using suitable formation method, such as plating, damascene, dual-damascene, or the like.

Figure 3:
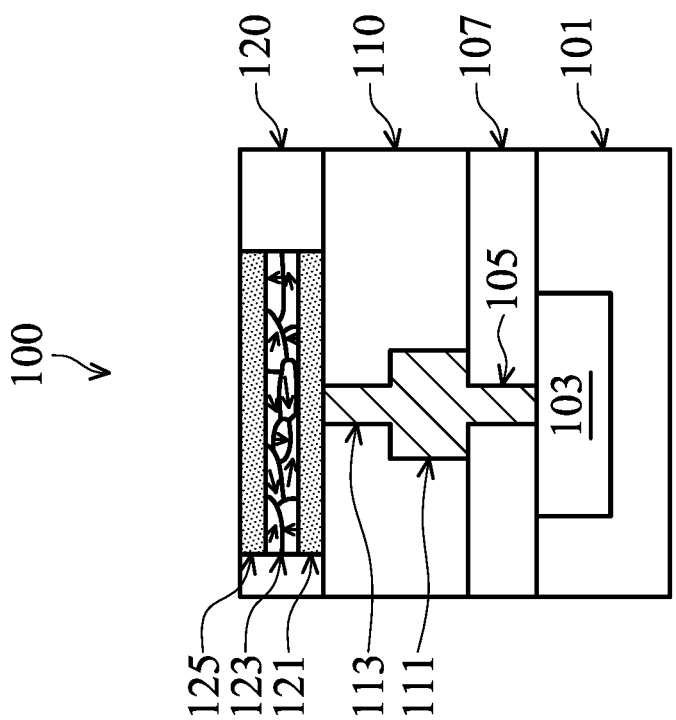

Next, in FIG. 3, the dielectric layer 120 is formed over the dielectric layer 110. The dielectric layer 120 may comprise a same or similar material as the dielectric layer 110, and may be formed using a same or similar formation method, thus details are not repeated. Next, an opening is formed in the dielectric layer 120 using, e.g., photolithography and patterning techniques. Next, a bottom electrode layer 121, a ferroelectric layer 123, and a top electrode layer 125 are formed successively in the opening. The bottom electrode layer 121 is electrically coupled to and contacts (e.g., physically contacts) the underlying conductive feature 113.

In some embodiments, the bottom electrode layer 121 comprises an electrical conductive material, such as TiN, TaN, W, Ru, Co, Cu, or the like, and is formed by a suitable deposition method such as PVD, CVD, plasma-enhanced CVD (PECVD), or the like. A thickness of the bottom electrode layer 121 is between about 20 nm and about 50 nm, in some embodiments.

Next, the ferroelectric layer 123 is formed over the bottom electrode layer 121. In the illustrated embodiments, the ferroelectric layer 123 comprises a ferroelectric material. In some embodiments, the ferroelectric material is a hafnium (Hf)-based material (also referred to as a hafnium-containing material) such as HfZrO, HfAlO, HfLaO, HfON, or $HfO_2$. A thickness of the hafnium-based material may be between about 5 nm and about 50 nm, as an example. In some embodiments, the ferroelectric layer 123 comprises a lead-based material (also referred to as a lead-containing material) such as lead zirconate titanate (PZT) or strontium bismuth tantalate (SBT). A thickness of the lead-based material may be between about 100 nm and about 5 μm. A suitable deposition method, such as atomic layer deposition (ALD), plasma-enhanced ALD (PEALD), CVD, or the like, may be used to form the ferroelectric layer 123.

Next, the top electrode layer 125 is formed over the ferroelectric layer 123. The top electrode layer 125 may be formed of a same or similar material as the bottom electrode layer 121 using a same or similar formation method, thus details are not repeated. A thickness of the top electrode layer 125 may be between about 20 nm and about 500 nm, as an example. After the top electrode layer 125 is formed, a planarization process, such as chemical mechanical planarization (CMP), may be performed to remove excess portions of the materials (e.g., 121, 123, 125) from the upper surface of the dielectric layer 120, and to achieve a coplanar upper surface between the top electrode layer 125 and the dielectric layer 120.

Figure 4:
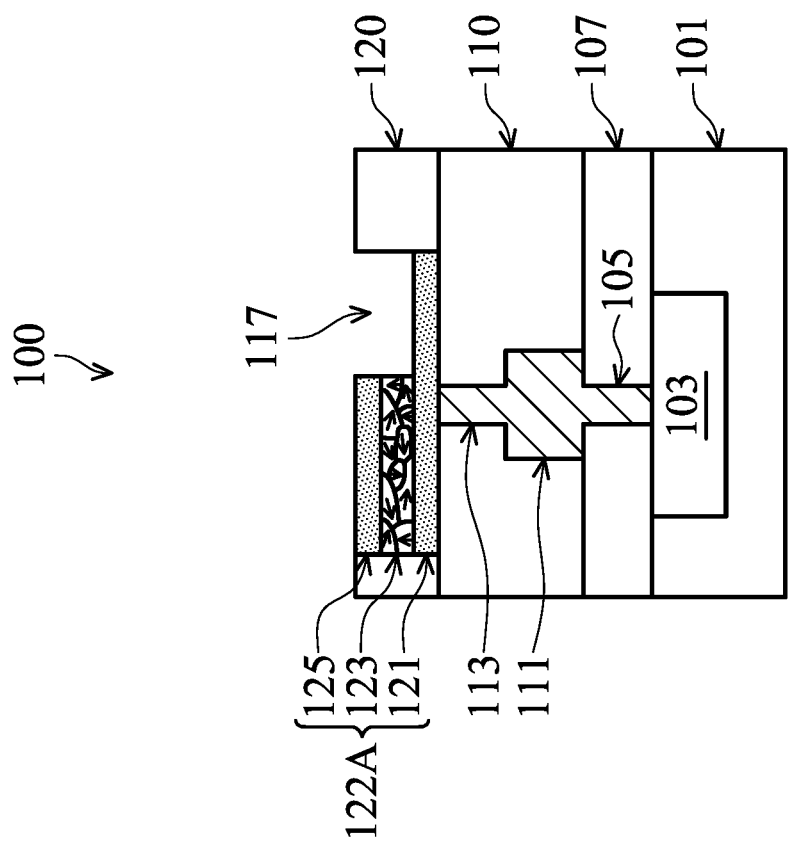

Next, in FIG. 4, a portion of the top electrode layer 125 and a portion of the ferroelectric layer 123 are removed to form an opening 117 in the dielectric layer 120 that exposes the bottom electrode layer 121. For example, a patterned mask layer, such as a patterned photoresist, is formed over the dielectric layer 120 and used as an etching mask in an anisotropic etching process to form the opening 117. After the etching process to form the opening 117, the remaining portion of the top electrode layer 125 forms the top electrode 125 of the ferroelectric structure 122A, the remaining portion of the ferroelectric layer 123 forms the ferroelectric layer 123 of the ferroelectric structure 122A, and the bottom electrode layer 121 is referred to as the bottom electrode 121 of the ferroelectric structure 122A.

One skilled in the art will appreciate that to form the ferroelectric structure 126 in the first region 200 of FIG. 1, the same or similar processing steps in FIGS. 2 and 3 may be performed, and the processing in FIG. 4 (e.g., forming the opening 117) may be omitted.

Figure 5:
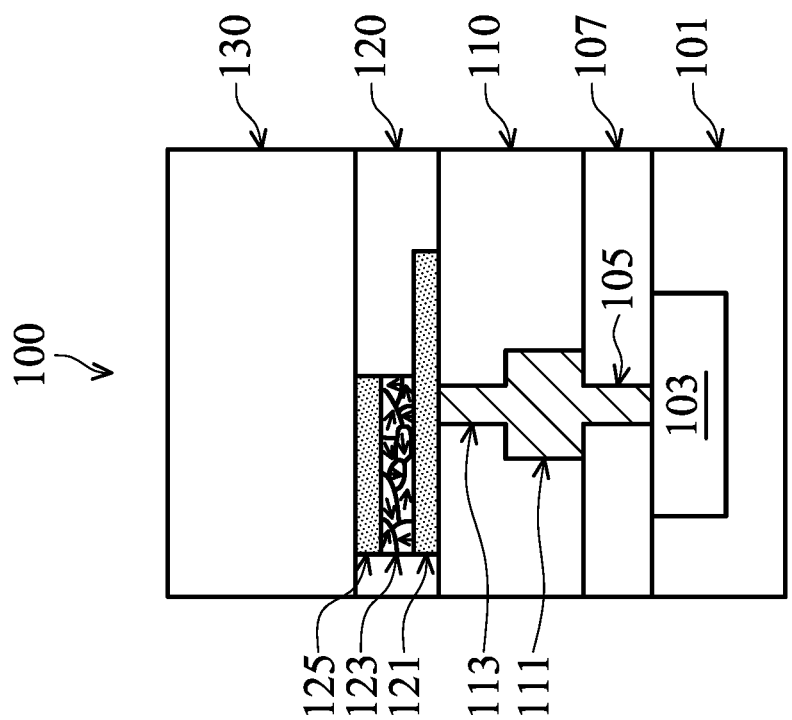

Next, in FIG. 5, a dielectric layer 130 is formed over the dielectric layer 120. The dielectric layer 130 also fills the opening 117. The dielectric layer 130 may comprise a same or similar material as the dielectric layer 110, and may be formed using a same or similar formation method, thus details are not repeated.

Figure 6:
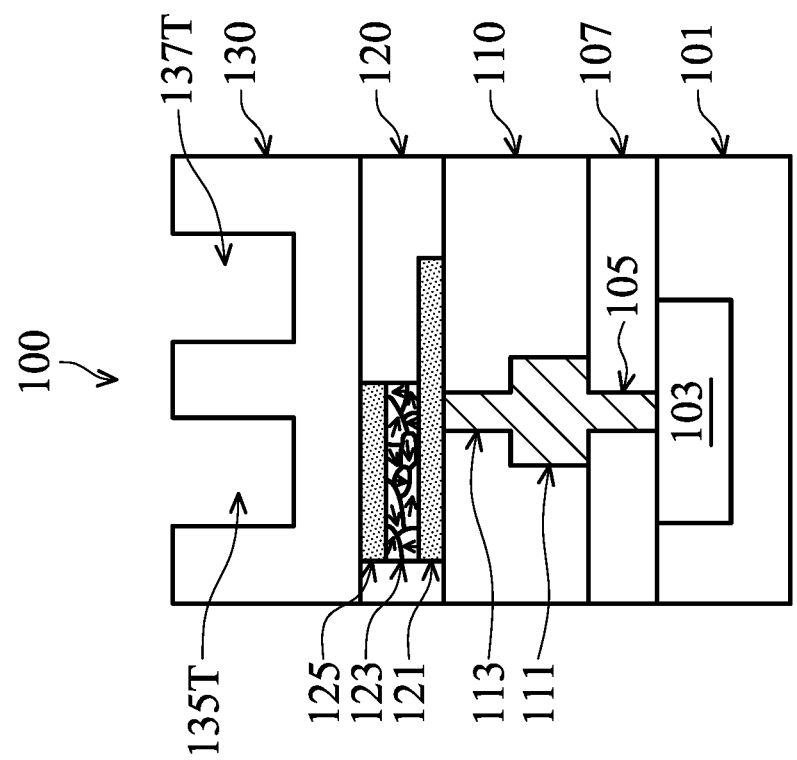

Next, in FIG. 6, trench openings 135T and 137T are formed in the dielectric layer 130. The trench openings 135T and 137T are formed by forming an patterned mask layer (e.g., a patterned photoresist layer) over the dielectric layer 130, then performing an anisotropic etching process to remove portions of the dielectric layer 130 exposed by the patterned mask layer, in some embodiments. The patterned mask layer is then removed after the trench openings are formed, e.g. by stripping or ashing.

Figure 7:
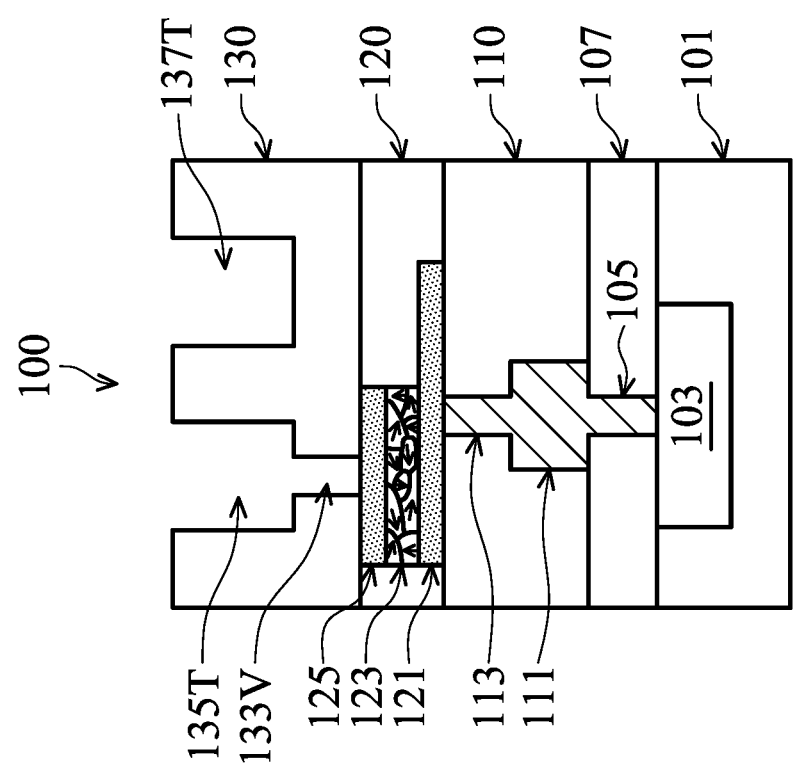

Next, in FIG. 7, a via opening 133V is formed that extends from the bottom of the trench opening 135T to the top electrode 125. In other words, the top electrode 125 is exposed by the via opening 133V. The via opening 133V may be formed by similar processing steps as those for forming the trench openings 135T, thus details are not repeated.

Figure 8:
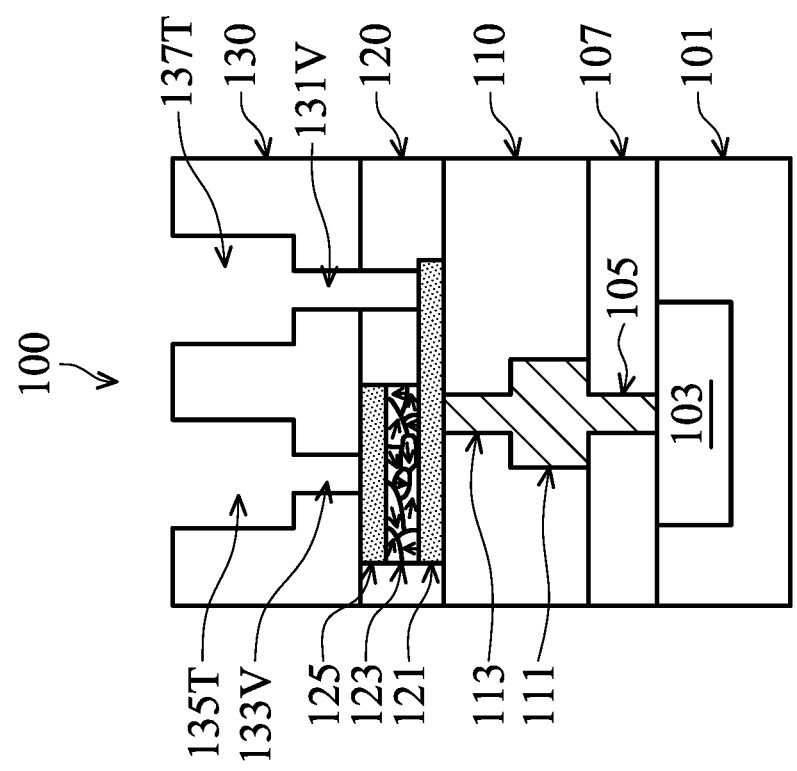

Next, in FIG. 8, a via opening 131V is formed that extends from the bottom of the trench opening 137T to the bottom electrode 121. In other words, the bottom electrode 121 is exposed by the via opening 131V.

Figure 9:
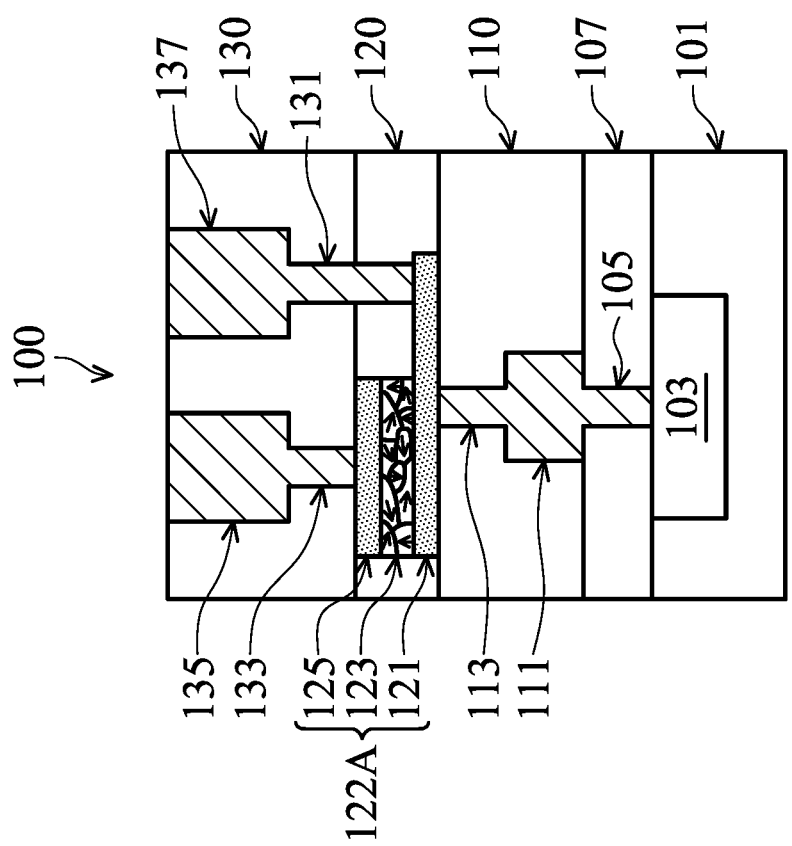

Next, in FIG. 9, conductive features, such as vias 131/133 and conductive lines 135/137, are formed in the via openings 131V/133V and trench openings 135T/137T, respectively. The conductive features comprises an electrically conductive material such as copper, aluminum, or the like, and are formed using suitable formation method, such as plating, damascene, dual-damascene, or the like. After being formed, the conductive feature 135 is electrically coupled to the top electrode 125 through the conductive feature 133, and the conductive feature 137 is electrically coupled to the upper surface of the bottom electrode 121 through the conductive feature 131.

Additional features may be formed in additional processing steps to finish the manufacturing of the semiconductor device 100, as one skilled in the art readily appreciates. For example, additional dielectric layers, additional conductive features, and/or additional electrical components may be formed and electrically coupled to the structure shown in FIG. 9 to finish the manufacturing of the semiconductor device 100. For simplicity, details are not discussed here.

Figure 10:
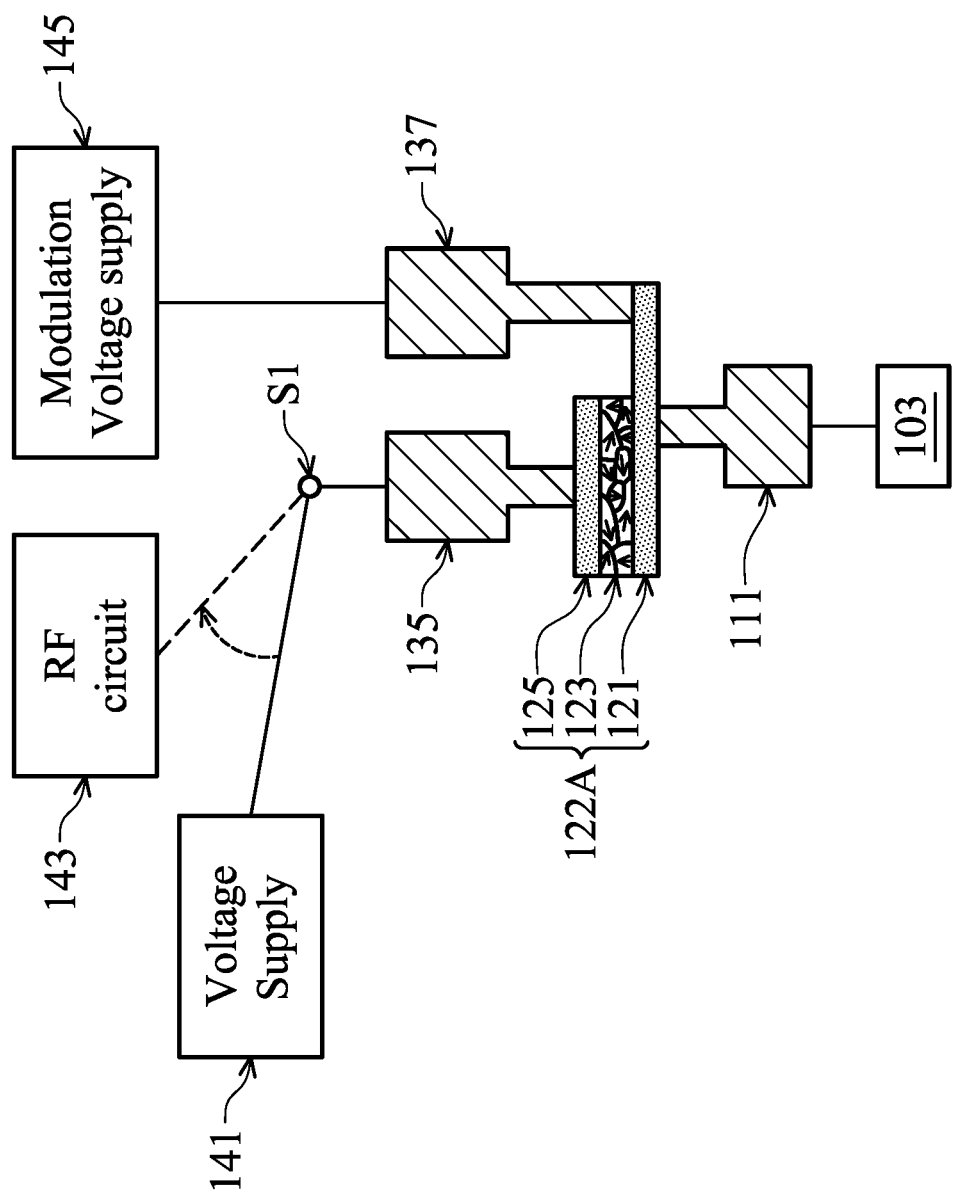
FIG. 10 illustrates various operation states of a tunable capacitor, in an embodiment.

FIG. 10 illustrates various operation states of a tunable capacitor 122A, in an embodiment. The tunable capacitor 122A may be the ferroelectric structure 122A in FIG. 1. For simplicity, FIG. 10 only illustrates the tunable capacitor 122A and it electrical connections, and other features, such as the dielectric layers 110, 120, 130 in FIG. 9, are not illustrated.

In some embodiments, when used in an RF circuit, the tunable capacitor 122A operates in two states, such as an initialization state and a normal operation state. In the initialization state, the capacitance of the tunable capacitor 122A is set by applying a positive or a negative voltage across the top electrode 125 and the bottom electrode 121. The positive or negative voltage sets the electrical polarization direction of the ferroelectric layer 123, thus setting the nominal capacitance of the tunable capacitor 122A. The capacitance of the tunable capacitor 122A may be further fine-tuned by applying a modulation voltage at the bottom electrode 121, as described below.

FIG. 10 illustrates a switch S1, which is electrically coupled to the top electrode 125 through, e.g., the conductive feature 135. The switch S1 may be any suitable switch, such as a transistor switch integrated in the semiconductor device. During the initialization state, the switch S1 is electrically couple to a voltage supply 141 (e.g., a +5V voltage supply), such that the top electrode 125 has a same voltage as the voltage supply 141. During the normal operation state, the switch S1 is electrically coupled to an RF circuit 143 (e.g., an oscillator or an RF filter) as indicated by the dashed line in FIG. 10, such that the tunable capacitor 122A is electrically coupled to the RF circuit 143 and functions as a (tunable) capacitor of an RF circuit. In other words, during the normal operation state, the tunable capacitor 122A and the RF circuit 143 work together to form a complete RF circuit and to provide designed RF functions. The RF circuit 143 may be integrated in the semiconductor device 100.

In FIG. 10, the lower surface of the bottom electrode 121 is electrically coupled to the electrical component 103 (e.g., a transistor), and the upper surface of the bottom electrode 121 is electrically coupled to a modulation voltage supply 145 through, e.g., the conductive feature 137. Since the dielectric constant of the ferroelectric layer 123 shows a dependence on the voltage applied, the capacitance of the tunable capacitor 122A may be fine-tuned (e.g., adjusted) by applying a modulation voltage at the bottom electrode 121 through the conductive feature 137, in some embodiments.

Operation of the tunable capacitor 122A is described below using an example. For example, consider a tunable capacitor 122A having a ferroelectric layer 123 that changes its electrical polarization direction from a first polarization direction to a second polarization direction at +3V. Assuming that during the initialization state, the ferroelectric layer 123 needs to be set to the second electrical polarization direction. Therefore, during the initialization state, the switch S1 is electrically coupled to the voltage supply 141, which supplies, e.g., a +5V voltage to the top electrode 125. Assuming that the bottom electrode 121 has a zero voltage due to its electrical connection in the circuit, the voltage difference between the top electrode 125 and the bottom electrode 121 is +5V, which is higher than the +3V needed to switch the electrical polarization direction of the ferroelectric layer 123. To fine-tune the capacitance of the tunable capacitor 122A, the modulation voltage supply 145 may apply a modulation voltage, e.g., a voltage between 0V and +2V to the bottom electrode 121. With such a modulation voltage applied, the voltage different between the top electrode 125 and the bottom electrode 121 is still above +3V, but may vary between +3V and +5V. The voltage variation causes changes in the dielectric constant of the ferroelectric layer 123, thus changing the capacitance of the tunable capacitor 122A. In other words, by varying the modulation voltage, the tunable capacitor 122A may provide a plurality of (e.g., 3, 4, or more) different capacitance values. In some embodiments, by varying the modulation voltage (e.g., continuously), the tunable capacitor 122A provides a continuously changing capacitance value within an adjustment range. For example, the capacitance of the tunable capacitor 122A may be changed between about 0.5 $C_{max}$ and $C_{max}$, wherein $C_{max}$ is the maximum capacitance value of the tunable capacitor 122A.

In some embodiments, the modulation voltage is applied in the initialization state and maintained (e.g., applied) in the normal operation state. The value of the modulation voltage may be adjusted (e.g., increased or decreased) during the normal operation state, e.g., based on user setting, to provide dynamically (e.g., real-time, or on-demand) adjustable capacitance for the tunable capacitor 122A. In some embodiments, the modulation voltage is not applied in the initialization state, but applied in the normal operation state. In yet other embodiments, the modulation voltage supply 145 is omitted, and therefore, the conductive feature 137 is not connected to a modulation voltage supply, in which case the tunable capacitor 122A behaves like a non-tunable capacitor with a fixed value.

Figure 11:
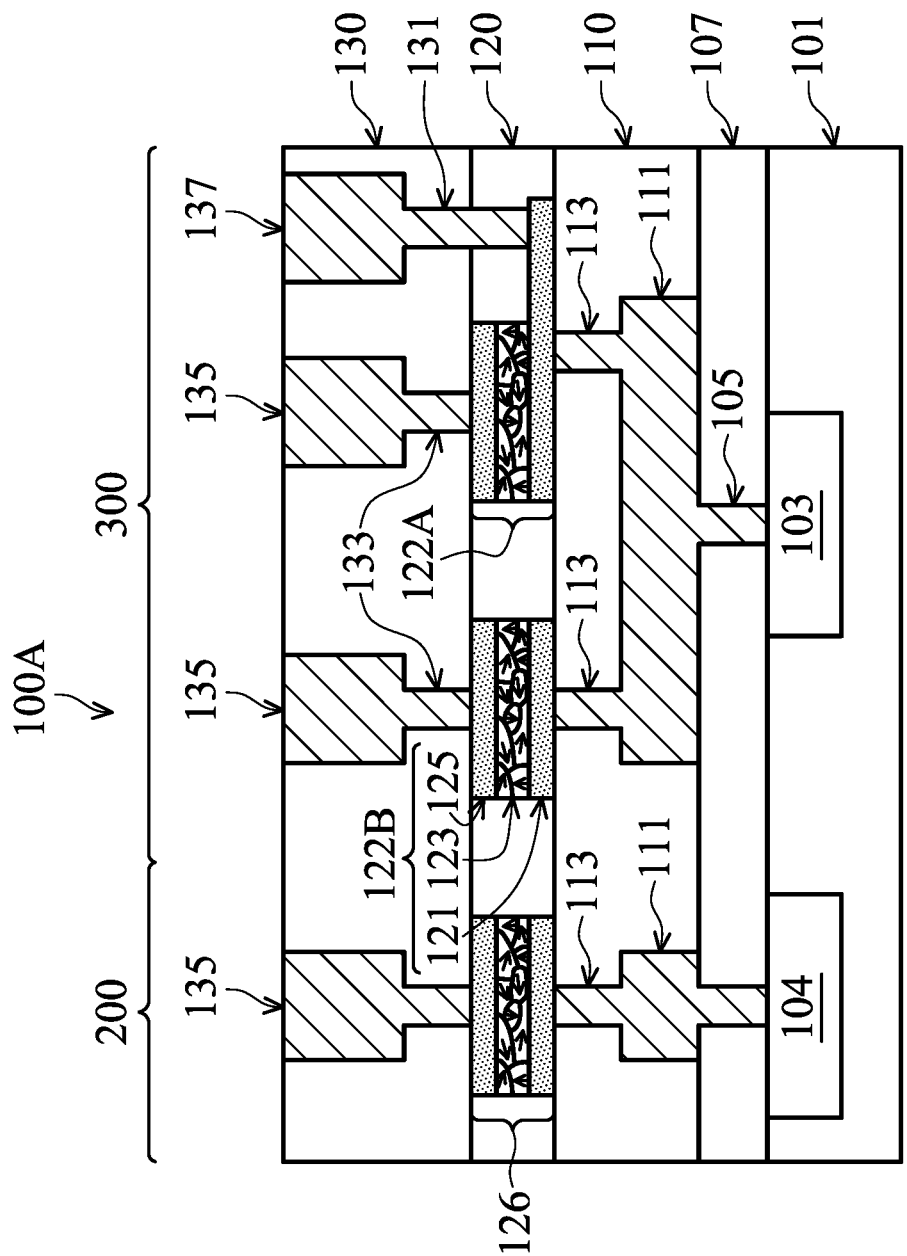
FIG. 11 illustrates a cross-sectional view of a semiconductor device having an FRAM memory cell and a tunable capacitor, in an embodiment.

FIG. 11 illustrates a cross-sectional view of a semiconductor device 100A having an FeRAM memory cell in the first region 200 and a tunable capacitor in the second region 300, in an embodiment. The semiconductor device 100A is similar to the semiconductor device 100 of FIG. 1, but the tunable capacitor of FIG. 11 includes two capacitors coupled in parallel. In particular, the tunable capacitor of FIG. 11 includes a capacitor 122A and another capacitor 122B. The capacitor 122A in FIG. 11 (e.g., a tunable capacitor) is the same as the tunable capacitor 122A in FIG. 1. The capacitor 122B in FIG. 11 has a same or similar structure as the ferroelectric structure 126 in the first region 200. The capacitor 122B is coupled in parallel to the tunable capacitor 122A to increase the capacitance of the tunable capacitor of FIG. 11, in some embodiments. FIG. 11 shows a conductive feature in that electrically couples the bottom electrodes 121 of the capacitors 122A/122B together. The top electrodes 125 of the capacitors 122A/122B may be coupled together by conductive features formed over the dielectric layer 130 (not shown).

Figure 12:
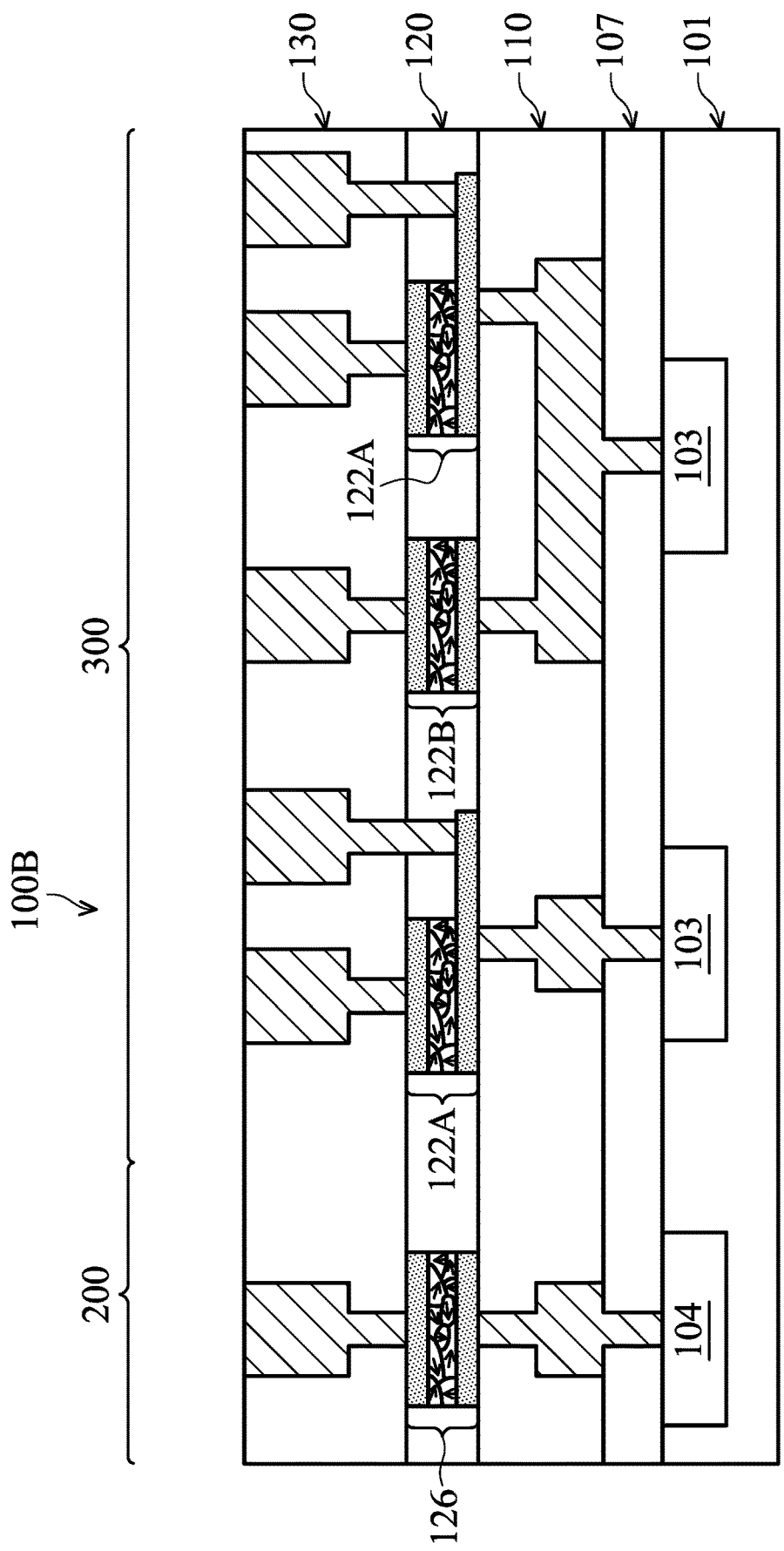
FIG. 12 illustrates a cross-sectional view of a semiconductor device having an FRAM memory cell and two different tunable capacitors, in an embodiment.

FIG. 12 illustrates a cross-sectional view of a semiconductor device 100B having an FeRAM memory cell and two different tunable capacitors, in an embodiment. The FeRAM memory cell in the first region 200 of FIG. 12 is the same as the FeRAM memory cell of FIG. 1. In the second region 300 of FIG. 12, two tunable capacitors are illustrated. The tunable capacitor 122A in the left of the second region 300 is the same as the tunable capacitor 122A in FIG. 1. The other tunable capacitor, which includes two capacitors coupled in parallel, is the same as the tunable capacitor in FIG. 11.

Figure 13B:
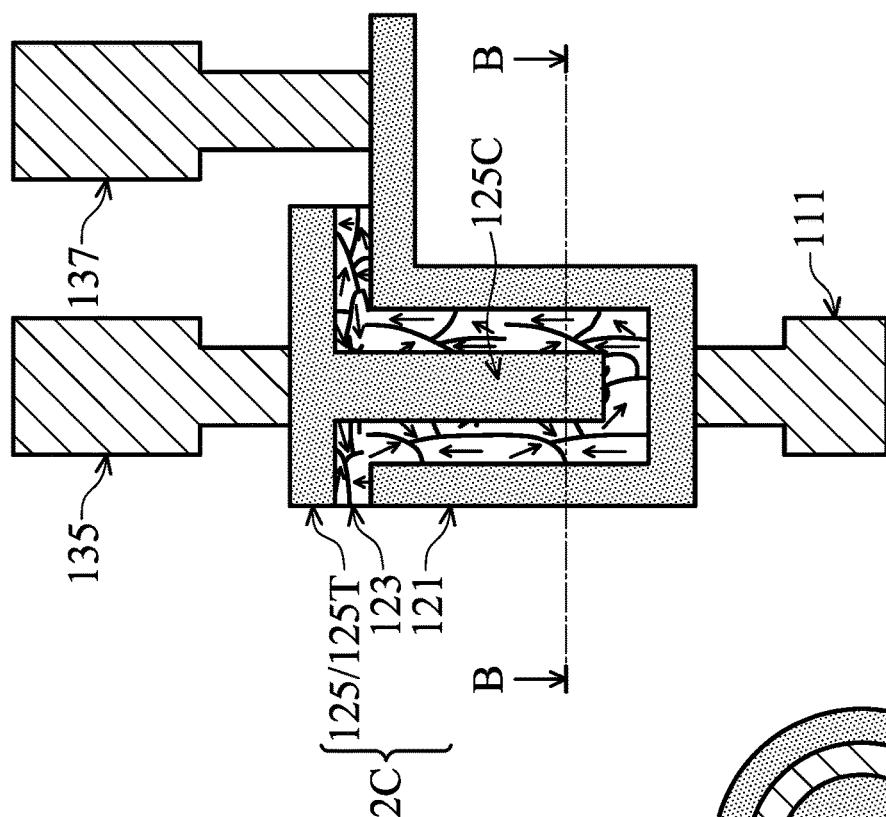
FIGS. 13A-13C illustrate various views of a tunable capacitor, in an embodiment.
Figure 13C:
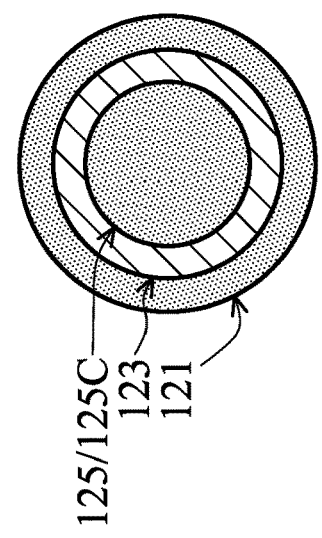
Figure 13A:
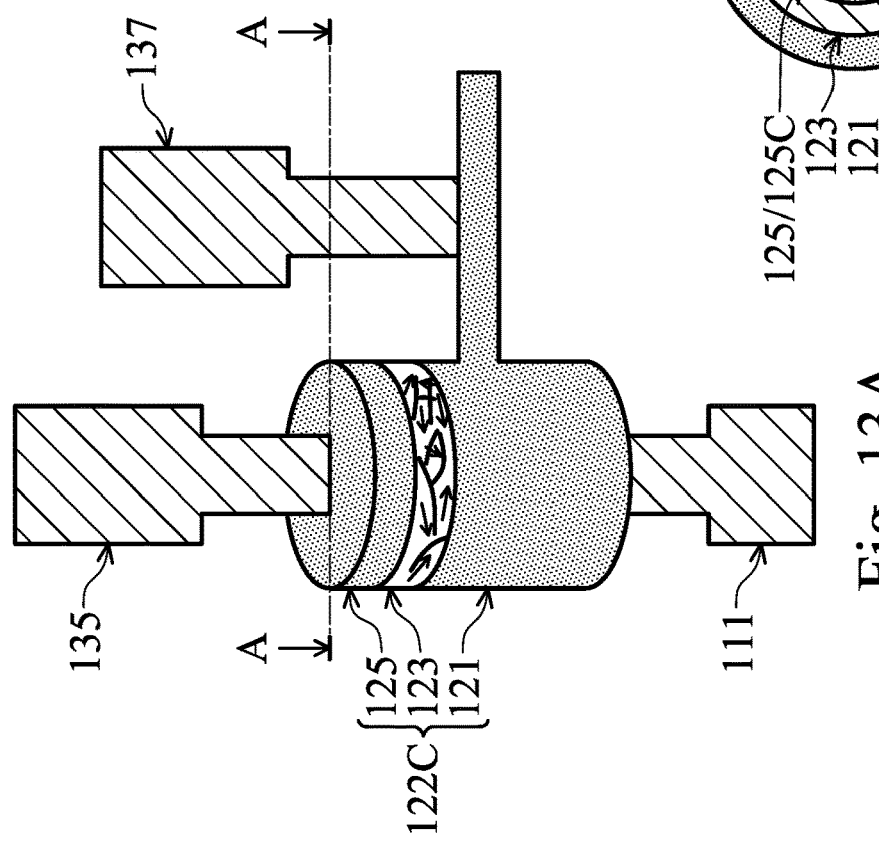

FIGS. 13A-13C illustrate various views (e.g., perspective view, cross-sectional view) of a tunable capacitor 122C, in an embodiment. FIG. 13A illustrates a perspective view of the tunable capacitor 122C, FIG. 13B illustrates a cross-sectional view of the tunable capacitor 122C along cross-section A-A in FIG. 13A, and FIG. 13C illustrates a cross-sectional view of the tunable capacitor 122C along cross-section B-B in FIG. 13B. FIG. 13A-13C further illustrates conductive features 135/137 (e.g., vias or conductive lines) that are connected to the tunable capacitor 122C.

As illustrated in FIGS. 13A-13C, unlike the tunable capacitor 122A which has parallel, plate-shaped top electrodes 125 and bottom electrode 121, the tunable capacitor 122C has cylinder shaped top electrode 125 and bottom electrode 121. In particular, the bottom electrode 121 has a hollow cylinder shape. The top electrode 125 has a center portion 125C that has a cylinder shape. The center portion 125C extends into and is surrounded by the bottom electrode 121. The top electrode 125 further has a top portion 125T that is over and connected to the center portion 125C. The ferroelectric layer 123 is between the top electrode 125 and the bottom electrode 121, and surrounds the cylinder shaped center portion 125C of the top electrode 125. Conductive features 135, 137, and 111 are electrically coupled to the top electrode 125, the upper surface of the bottom electrode 121, and the lower surface of the bottom electrode 121, respectively.

Figure 14:
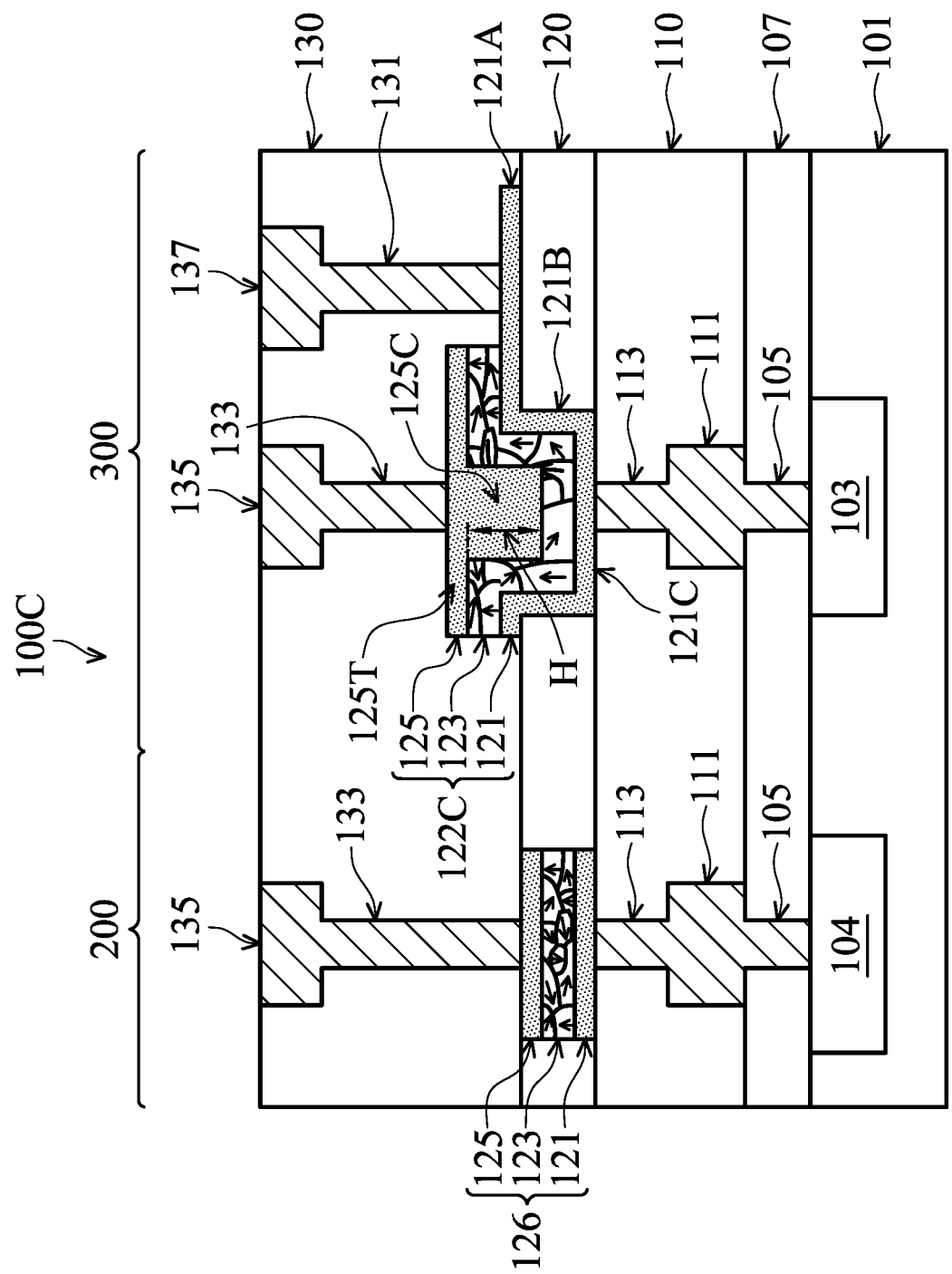
FIG. 14 illustrates a cross-sectional view of a semiconductor device having an FeRAM memory cell and the tunable capacitor of FIGS. 13A-13C, in an embodiment.

FIG. 14 illustrates a cross-sectional view of a semiconductor device 100C having an FeRAM memory cell and the tunable capacitor 122C of FIGS. 13A-13C, in an embodiment. In FIG. 14, the FeRAM memory cell in the first region 200 is the same as the FeRAM memory cell of FIG. 1. In the example of FIG. 14, the ferroelectric structure 126 is disposed in the dielectric layer 120. The lower surface of the bottom electrode 121 of the ferroelectric structure 126 facing the substrate 101 is level with the lower surface of the dielectric layer 120, and the upper surface of the top electrode 125 of the ferroelectric structure 126 is level with the upper surface of the dielectric layer 120 facing away from the substrate 101.

The tunable capacitor 122C is formed at least partially in the dielectric layer 120. As illustrated in FIG. 14, the bottom electrode 121 of the tunable capacitor 122C has first portions 121A, second portions 121B, and third portions 121C. The first portions 121A extend along an upper surface of the dielectric layer 120 distal from the substrate 101. The second portions 121B extend from the upper surface of the dielectric layer 120 to a lower surface of the dielectric layer 120 facing the substrate 101. Third portions 121C are disposed at the lower surface of the dielectric layer 120 and extend in parallel with the lower surface of the dielectric layer 120. The third portions 121C connect the second portions 121B disposed along opposing inner sidewalls of the dielectric layer 120.

Still referring to FIG. 14, the ferroelectric layer 123 of the tunable capacitor 122C extends conformally along the upper surface of the bottom electrode 121. Therefore, the ferroelectric layer 123 of the tunable capacitor 122C has first portions extending along the first portions 121A of the bottom electrode 121, second portions extending along the second portion 121B of the bottom electrode 121, and third portions extending along the third portions 121C of the bottom electrode 121.

The top electrode 125 of the tunable capacitor 122C has a center portion 125C that extends into the dielectric layer 120 and is surrounded by the ferroelectric layer 123. The top electrode 125 of the tunable capacitor 122C further has a top portion 125T that is disposed over the center portion 125C and covers (e.g., physically contacts) an upper surface of the ferroelectric layer 123.

As illustrated in FIG. 14, a lowest surface (e.g., the lower surface of the third portions 121C) of the bottom electrode 121 of the tunable capacitor 122C facing the substrate 101 is level with the lower surface of the dielectric layer 120, and an upper surface of the top electrode 125 of the tunable capacitor 122C facing away from the substrate 101 extends further from the substrate 101 than the upper surface of the dielectric layer 120. In other words, portions of the tunable capacitor 122C extend above the upper surface of the dielectric layer 120. Therefore, compared with the tunable capacitors in FIGS. 1, 11, and 12, the cylinder shaped structure of the tunable capacitor 122C provides an additional dimension (e.g., the vertical dimension in FIG. 14) to adjust the capacitance of the tunable capacitor 122C. For example, the height H of the center portion 125C of the top electrode 125 may be adjusted (e.g., increased or decreased) to change the area between the top electrode 125 and the bottom electrode 121, thereby changing the capacitance of the tunable capacitor 122C. Therefore, the tunable capacitor 122C may also be referred to as having a three-dimension (3D) structure, or having a 3D cylinder shaped structure.

The tunable capacitor 122C may operate in two operation stage, such as an initialization state and a normal operation state, similar to those discussed above with reference to FIG. 10. Therefore, details are not repeated here.

FIGS. 15-19 illustrate cross-sectional views of a portion of the semiconductor device 100C of FIG. 14 at various stages of manufacturing, in an embodiment. In particular, FIGS. 15-19 only illustrate the second region 300 of FIG. 14 that includes the tunable capacitor 122C, and the first region 200 in FIG. 14 is not illustrated. In addition, for simplicity, certain layers (e.g., 101, 107) in FIG. 14 are not illustrated. One skilled in the art, upon reading the present disclosure, would readily appreciate that corresponding features in the first region 200, such as the ferroelectric structure 126, are formed in the same or similar processing steps using a same or similar material(s).

Figure 15:
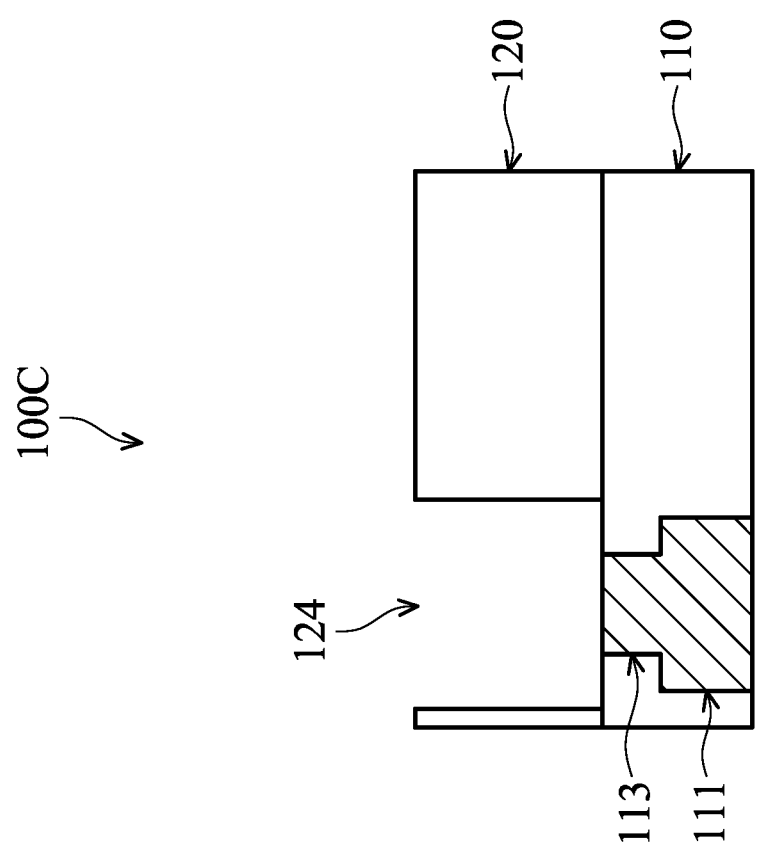
FIGS. 15-19 illustrate cross-sectional views of a portion of the semiconductor device of FIG. 14 at various stages of manufacturing, in an embodiment.

Referring now to FIG. 15, conductive features 111/113 are formed in the dielectric layer 110. Next, the dielectric layer 120 is formed over the dielectric layer 110, and an opening 124 is formed in the dielectric layer 120 using, e.g., photolithography and etching techniques. The opening 124 exposes the upper surface of the conductive feature 113.

Figure 16:
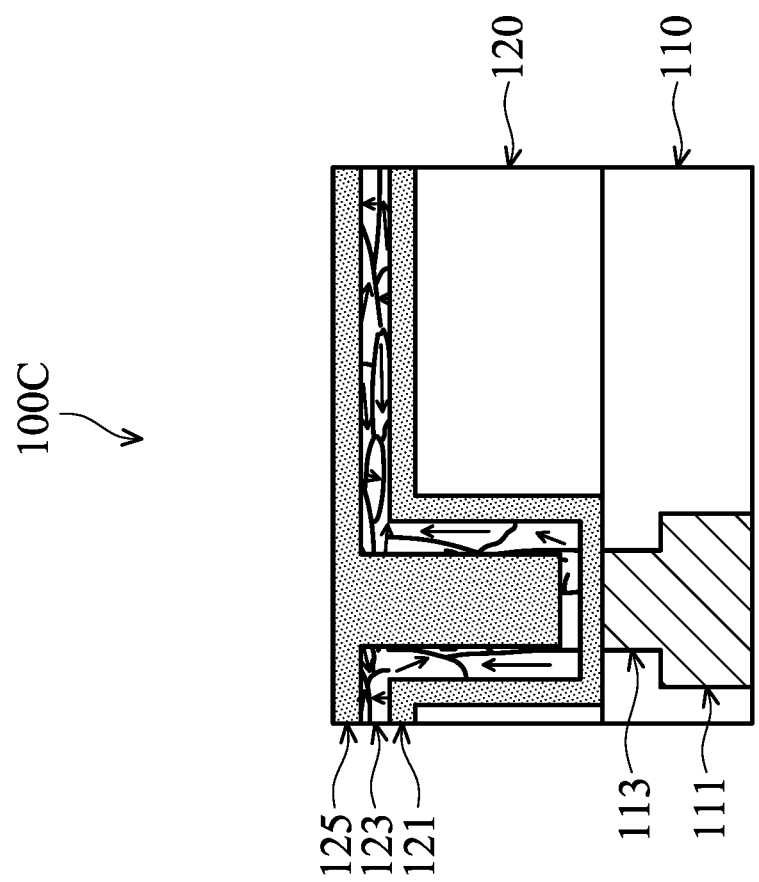

Next, in FIG. 16, the bottom electrode layer 121 is formed to line the upper surface of the dielectric layer 120, and to line sidewalls and a bottom of the opening 124. The bottom electrode layer 121 may be formed using a conformal deposition method, such as ALD. After the bottom electrode layer 121 is formed, the ferroelectric layer 123 and the top electrode layer 125 are conformally formed over the bottom electrode layer 121 successively, e.g., using conformal deposition methods such as ALD.

Figure 17:
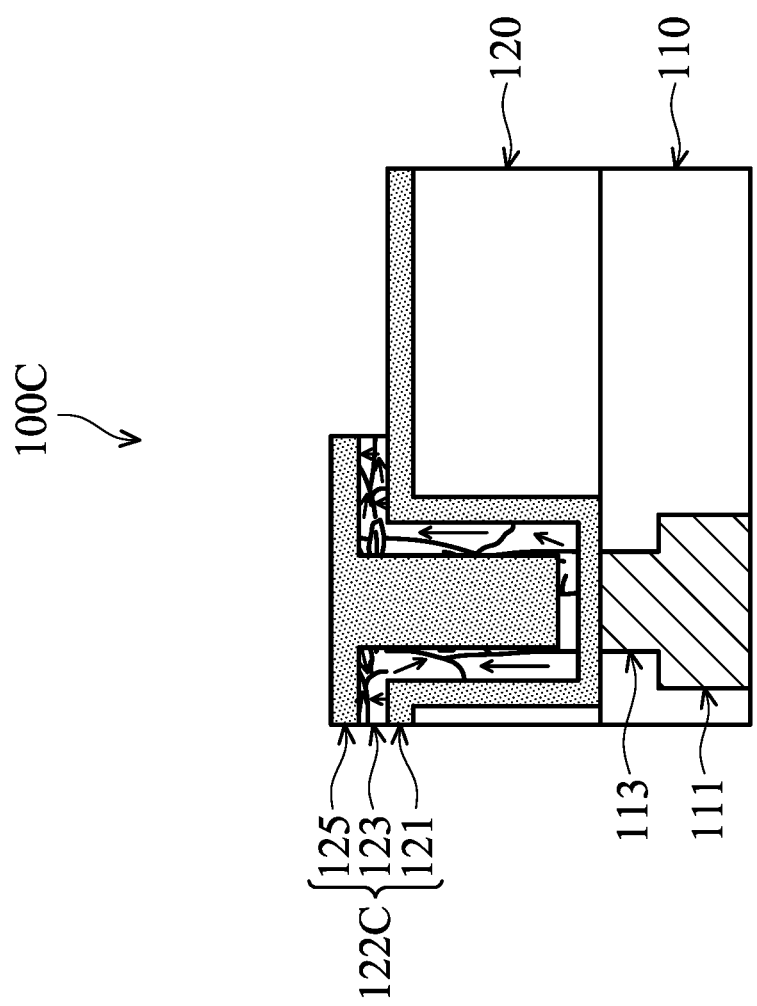

Next, in FIG. 17, portions of the top electrode layer 125 and portions of the ferroelectric layer 123 are removed to expose the bottom electrode layer 121. An anisotropic etching processing using a patterned etching mask may be performed to remove portions of the top electrode layer 125 and portions of the ferroelectric layer 123. Additional etching process may be performed to pattern the bottom electrode layer 121. After the etching process(es), the remaining portions of the top electrode layer 125 form the top electrode 125 of the tunable capacitor 122C, the remaining portions of the ferroelectric layer 123 form the ferroelectric layer 123 of the tunable capacitor 122C, and the remaining portions of the bottom electrode layer 121 form the bottom electrode 121 of the tunable capacitor 122C.

Figure 18:
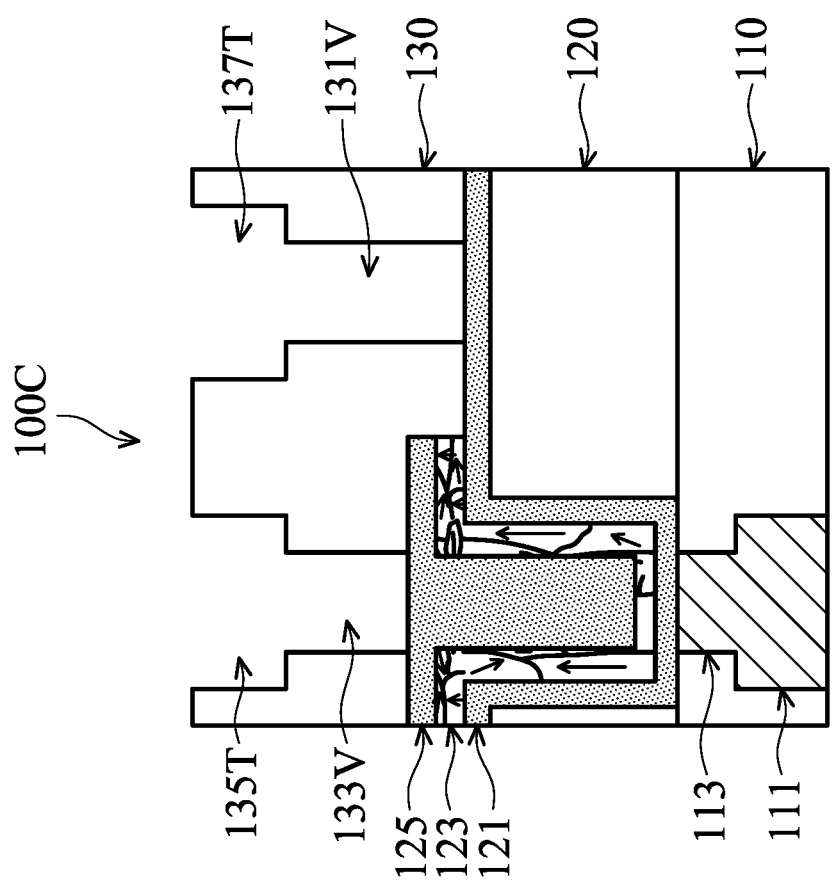

Next, in FIG. 18, the dielectric layer 130 is formed over the dielectric layer 120. Next, trench openings 135T/137T and via openings 133V/131V are formed in the dielectric layer 130. The top electrode 125 and the bottom electrode 121 are each exposed by a respective via opening.

Figure 19:
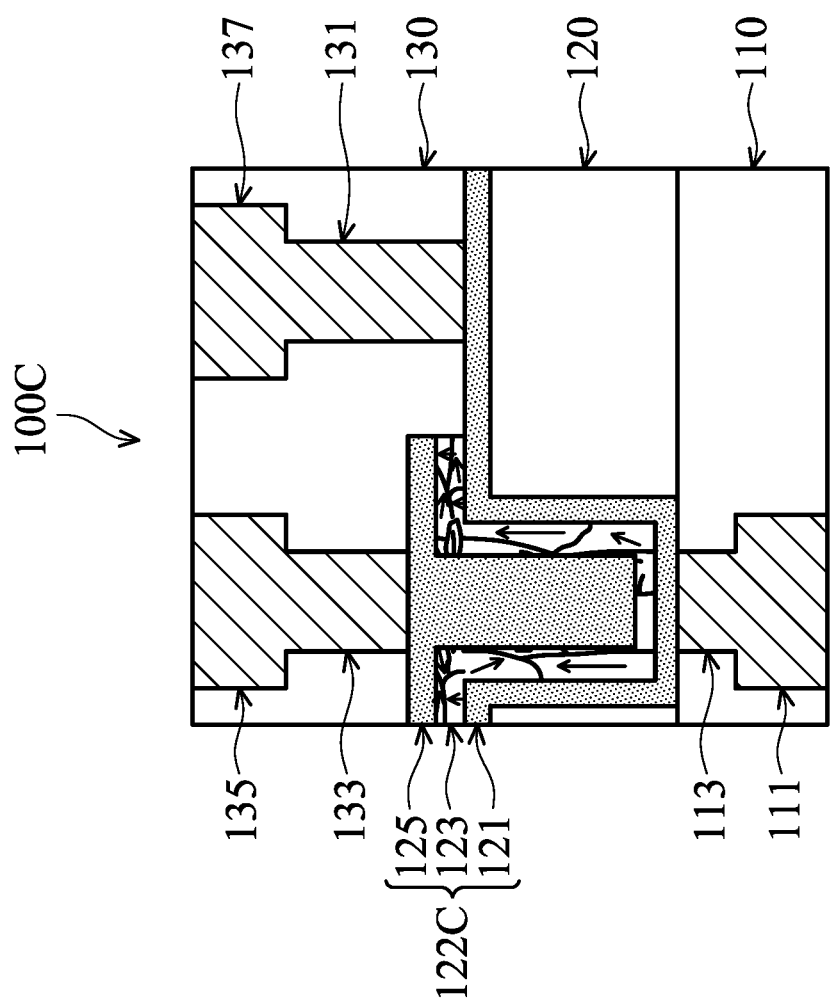

Next, in FIG. 19, conductive lines 135/137 and vias 133/131 are formed in the trench openings 135T/137T and via openings 133V/131V, respectively. Therefore, the tunable capacitor 122C and the conductive features connected to it as illustrated in FIG. 14 are formed.

Figure 20:
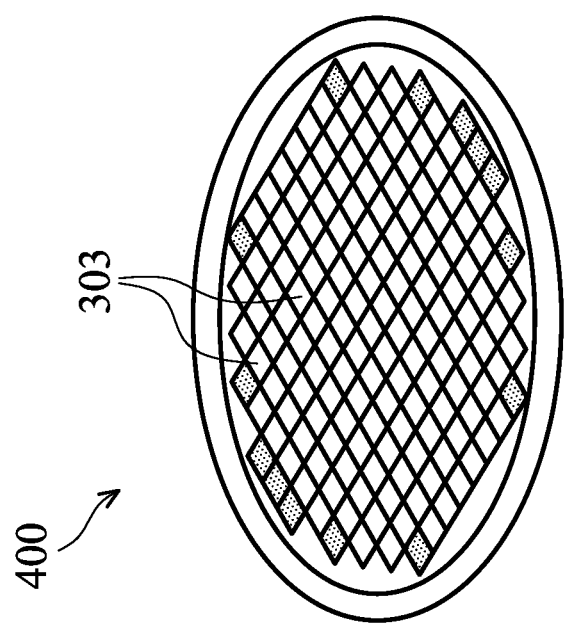
FIG. 20 illustrates a perspective view of a wafer comprising a plurality of semiconductor dies, in an embodiment.

FIG. 20 illustrates a perspective view of a wafer 400 comprising a plurality of semiconductor dies 303, in an embodiment. Each of the semiconductor die 303 may include a memory region (e.g., an FeRAM device region) and a RF circuit region (e.g., having tunable capacitors), such as those illustrated in FIGS. 1, 11, 12, and 14.

Figure 21:
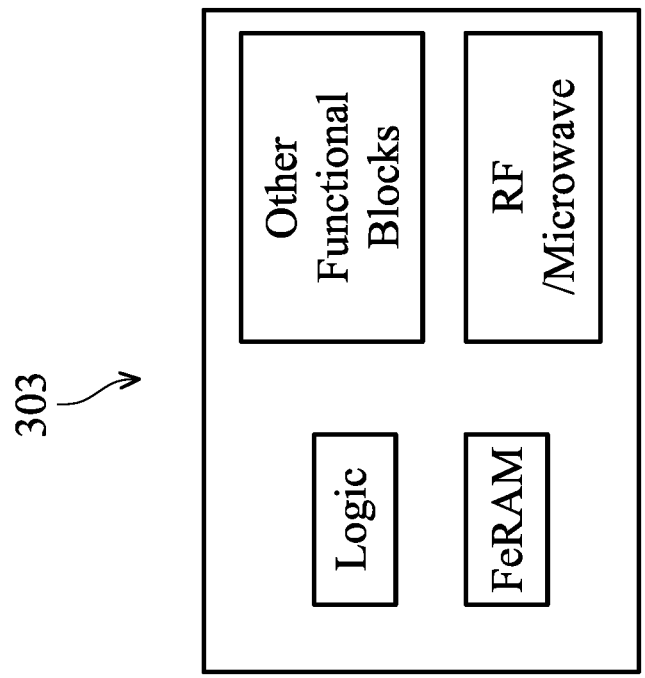
FIG. 21 illustrates a block diagram of a semiconductor die in FIG. 20, in an embodiment.

FIG. 21 illustrates a block diagram of a semiconductor die 303, in an embodiment. As illustrated in FIG. 21, the semiconductor die 303 includes a FeRAM device region (e.g., having ferroelectric structures 126 to form 1T-1C memory cells) and an RF/Microwave circuit region (e.g., having tunable capacitors such as 122A, combination of 122A and 122B, or 122C). The semiconductor die 303 may further include other device regions, such as a logic device region, and regions for other functional blocks.

Figure 22:
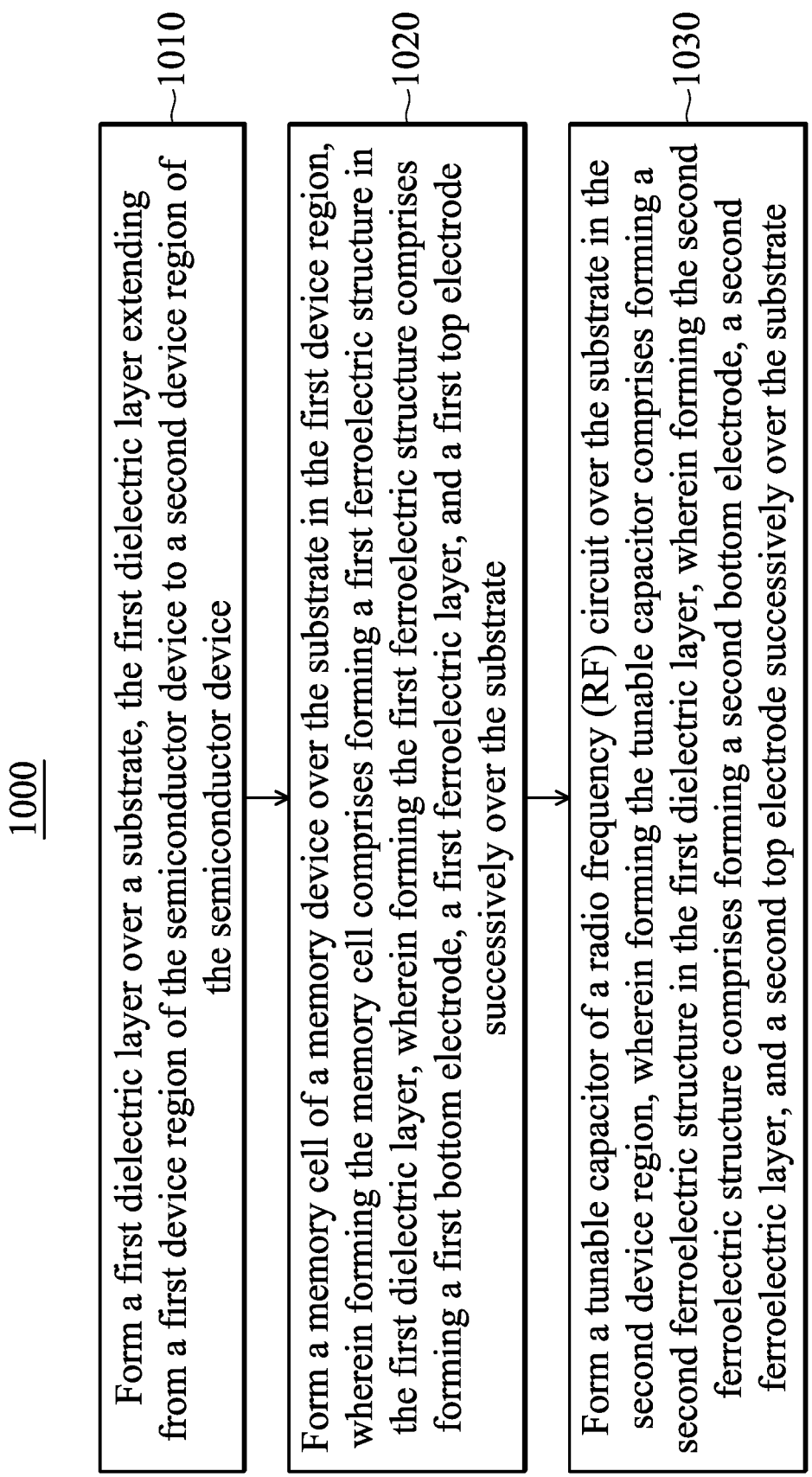
FIG. 22 is a flow chart of a method of forming a semiconductor device, in an embodiment.

FIG. 22 is a flow chart of a method 1000 of forming a semiconductor device, in an embodiment. It should be understood that the embodiment method shown in FIG. 22 is merely an example of many possible embodiment methods. One of ordinary skill in the art would recognize many variations, alternatives, and modifications. For example, various steps as illustrated in FIG. 22 may be added, removed, replaced, rearranged, or repeated.

Referring now to FIG. 22, at step 1010, a first dielectric layer is formed over a substrate, the first dielectric layer extending from a first device region of the semiconductor device to a second device region of the semiconductor device. At step 1020, a memory cell of a memory device is formed over the substrate in the first device region, wherein forming the memory cell comprises forming a first ferroelectric structure in the first dielectric layer, wherein forming the first ferroelectric structure comprises forming a first bottom electrode, a first ferroelectric layer, and a first top electrode successively over the substrate. At step 1030, a tunable capacitor of a radio frequency (RF) circuit is formed over the substrate in the second device region, wherein forming the tunable capacitor comprises forming a second ferroelectric structure in the first dielectric layer, wherein forming the second ferroelectric structure comprises forming a second bottom electrode, a second ferroelectric layer, and a second top electrode successively over the substrate.

Embodiments may achieve advantages. For example, in the present disclosure, the existing FeRAM process, which is used for forming FeRAM memory cells in a memory device region of the semiconductor device, is also used for forming tunable capacitors in an RF circuit region of the semiconductor region, thus allowing memory and high frequency functionalities on a same chip (e.g., an SoC) for diverse applications (e.g., FeRAM and high frequency tunable circuit). The disclosed tunable capacitors in the RF circuit region and the ferroelectric structures in the FeRAM memory cells may be formed in a same dielectric layer using a same processing step(s) and a same material(s), thus reducing manufacturing cost and can be easily integrated into existing manufacturing flow.

In accordance with an embodiment, a semiconductor device includes: a substrate; a first dielectric layer over the substrate; a memory cell over the substrate in a first region of the semiconductor device, wherein the memory cell comprises a first ferroelectric structure in the first dielectric layer, wherein the first ferroelectric structure comprises a first bottom electrode, a first top electrode, and a first ferroelectric layer in between; and a tunable capacitor over the substrate in a second region of the semiconductor device, wherein the tunable capacitor comprises a second ferroelectric structure, wherein the second ferroelectric structure comprises a second bottom electrode, a second top electrode, and a second ferroelectric layer in between, wherein at least a portion of the second ferroelectric structure is in the first dielectric layer. In an embodiment, the first region is a memory device region comprising a memory device, and the second region is a radio frequency (RF) circuit region comprising an RF circuit. In an embodiment, the first ferroelectric structure is configured to be a part of a memory device, and the second ferroelectric structure is configured to be a part of a radio frequency (RF) circuit. In an embodiment, the first top electrode and the first bottom electrode have a same size, wherein the second top electrode is smaller than the second bottom electrode. In an embodiment, the semiconductor device further includes: a first conductive feature and a second conductive feature over the substrate in the first region of the semiconductor device, wherein the first conductive feature is over and contacts the first top electrode, and the second conductive feature is under and contacts the first bottom electrode; and a third conductive feature, a fourth conductive feature, and a fifth conductive feature over the substrate in the second region of the semiconductor device, wherein the third conductive feature is over and contacts the second top electrode, the fourth conductive feature is over and contacts an upper surface of the second bottom electrode distal from the substrate, and the fifth conductive feature is under and contacts a lower surface of the second bottom electrode facing the substrate. In an embodiment, the third conductive feature is configured to be coupled to a voltage supply during an initialization state of the tunable capacitor, wherein the third conductive feature is configured to be coupled to a radio frequency (RF)

circuit during a normal operation state of the tunable capacitor. In an embodiment, the fifth conductive feature is configured to be coupled to a modulation voltage supply for fine tuning a capacitance of the tunable capacitor during the normal operation state. In an embodiment, a modulation voltage provided by the modulation voltage supply is configured to be varied during the normal operation state. In an embodiment, the first top electrode and the second top electrode have a coplanar upper surface with the first dielectric layer, wherein the first bottom electrode and the second bottom electrode have a coplanar lower surface with the first dielectric layer. In an embodiment, the second bottom electrode has first portions extending along an upper surface of the first dielectric layer distal from the substrate, second portions extending from the upper surface of the first dielectric layer to a lower surface of the first dielectric layer facing the substrate, and third portions at the lower surface of the first dielectric layer connecting the second portions and extending in parallel with the lower surface of the first dielectric layer. In an embodiment, the second ferroelectric layer extends conformally along an upper surface of the second bottom electrode, wherein the second top electrode has a first portion extending into the first dielectric layer and being surrounded by the second ferroelectric layer, and has a second portion over the first portion and covering an upper surface of the second ferroelectric layer.

In accordance with an embodiment, a semiconductor device includes: a substrate; a memory device over a first region of the substrate, wherein the memory device comprises a first ferroelectric structure that includes a first top electrode, a first ferroelectric film, and a first bottom electrode; and a radio frequency (RF) device over a second region of the substrate, wherein the RF device comprises a tunable capacitor that includes a second ferroelectric structure, wherein the second ferroelectric structure comprises a second top electrode, a second ferroelectric film, and a second bottom electrode. In an embodiment, the first ferroelectric structure is disposed in a first dielectric layer over the substrate, wherein the second ferroelectric structure is disposed at least partially in the first dielectric layer. In an embodiment, a lower surface of the first bottom electrode facing the substrate is level with a lower surface of the second bottom electrode facing the substrate. In an embodiment, an upper surface of the first top electrode facing away from the substrate is level with an upper surface of the second top electrode facing away from the substrate. In an embodiment, an upper surface of the first top electrode facing away from the substrate is level with an upper surface of the first dielectric layer facing away from the substrate, and wherein an upper surface of the second top electrode facing away from the substrate extends further from the substrate than the upper surface of the first dielectric layer.

In accordance with an embodiment, a method of forming a semiconductor device includes: forming a first dielectric layer over a substrate, the first dielectric layer extending from a first device region of the semiconductor device to a second device region of the semiconductor device; forming a memory cell of a memory device over the substrate in the first device region, wherein forming the memory cell comprises forming a first ferroelectric structure in the first dielectric layer, wherein forming the first ferroelectric structure comprises forming a first bottom electrode, a first ferroelectric layer, and a first top electrode successively over the substrate; and forming a tunable capacitor of a radio frequency (RF) circuit over the substrate in the second device region, wherein forming the tunable capacitor comprises forming a second ferroelectric structure in the first dielectric layer, wherein forming the second ferroelectric structure comprises forming a second bottom electrode, a second ferroelectric layer, and a second top electrode successively over the substrate. In an embodiment, the first ferroelectric structure and the second ferroelectric structure are formed in the same processing steps. In an embodiment, the first bottom electrode and the second bottom electrode are formed of a first conductive material using a same formation method, wherein the first ferroelectric layer and the second ferroelectric layer are formed of a ferroelectric material using a same formation method, and wherein the first top electrode and the second top electrode are formed of a second conductive material using a same formation method. In an embodiment, the method further includes: forming a first conductive feature over and contacting an upper surface of the second bottom electrode distal from the substrate; and forming a second conductive feature under and contacting a lower surface of the second bottom electrode facing the substrate.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A semiconductor device comprising:
    a substrate;
    a first dielectric layer over the substrate;
    a memory cell over the substrate in a first region of the semiconductor device, wherein the memory cell comprises a first ferroelectric structure in the first dielectric layer, wherein the first ferroelectric structure comprises a first bottom electrode, a first top electrode, and a first ferroelectric layer in between; and
    a tunable capacitor over the substrate in a second region of the semiconductor device, wherein the tunable capacitor comprises a second ferroelectric structure, wherein the second ferroelectric structure comprises a second bottom electrode, a second top electrode, and a second ferroelectric layer in between, wherein at least a portion of the second ferroelectric structure is in the first dielectric layer, wherein the first top electrode and the first bottom electrode have a same size, wherein the second top electrode is smaller than the second bottom electrode.

2. The semiconductor device of claim 1, wherein the first region is a memory device region comprising a memory device, and the second region is a radio frequency (RF) circuit region comprising an RF circuit.

3. The semiconductor device of claim 1, wherein the first ferroelectric structure is configured to be a part of a memory device, and the second ferroelectric structure is configured to be a part of a radio frequency (RF) circuit.

4. The semiconductor device of claim 1, further comprising:
    a first conductive feature and a second conductive feature over the substrate in the first region of the semiconductor device, wherein the first conductive feature is over and contacts the first top electrode, and the second conductive feature is under and contacts the first bottom electrode; and
    a third conductive feature, a fourth conductive feature, and a fifth conductive feature over the substrate in the second region of the semiconductor device, wherein the third conductive feature is over and contacts the second top electrode, the fourth conductive feature is over and contacts an upper surface of the second bottom electrode distal from the substrate, and the fifth conductive feature is under and contacts a lower surface of the second bottom electrode facing the substrate.

5. The semiconductor device of claim 4, wherein the third conductive feature is configured to be coupled to a voltage supply during an initialization state of the tunable capacitor, wherein the third conductive feature is configured to be coupled to a radio frequency (RF) circuit during a normal operation state of the tunable capacitor.

6. The semiconductor device of claim 4, wherein the fourth conductive feature is configured to be coupled to a modulation voltage supply for fine tuning a capacitance of the tunable capacitor during the normal operation state.

7. The semiconductor device of claim 6, wherein a modulation voltage provided by the modulation voltage supply is configured to be varied during the normal operation state.

8. The semiconductor device of claim 1, wherein the first top electrode and the second top electrode have a coplanar upper surface with the first dielectric layer, wherein the first bottom electrode and the second bottom electrode have a coplanar lower surface with the first dielectric layer.

9. The semiconductor device of claim 1, wherein the second bottom electrode has first portions extending along an upper surface of the first dielectric layer distal from the substrate, second portions extending from the upper surface of the first dielectric layer to a lower surface of the first dielectric layer facing the substrate, and third portions at the lower surface of the first dielectric layer connecting the second portions and extending in parallel with the lower surface of the first dielectric layer.

10. The semiconductor device of claim 9, wherein the second ferroelectric layer extends conformally along an upper surface of the second bottom electrode, wherein the second top electrode has a first portion extending into the first dielectric layer and being surrounded by the second ferroelectric layer, and has a second portion over the first portion and covering an upper surface of the second ferroelectric layer.

11. A semiconductor device comprising:
a substrate;
a memory device over a first region of the substrate, wherein the memory device comprises a first ferroelectric structure that includes a first top electrode, a first ferroelectric film, and a first bottom electrode; and
a radio frequency (RF) device over a second region of the substrate, wherein the RF device comprises a tunable capacitor that includes a second ferroelectric structure, wherein the second ferroelectric structure comprises a second top electrode, a second ferroelectric film, and a second bottom electrode, wherein the second bottom electrode is wider than the second top electrode.

12. The semiconductor device of claim 11, wherein the first ferroelectric structure is disposed in a first dielectric layer over the substrate, wherein the second ferroelectric structure is disposed at least partially in the first dielectric layer.

13. The semiconductor device of claim 12, wherein a lower surface of the first bottom electrode facing the substrate is level with a lower surface of the second bottom electrode facing the substrate.

14. The semiconductor device of claim 13, wherein an upper surface of the first top electrode facing away from the substrate is level with an upper surface of the second top electrode facing away from the substrate.

15. The semiconductor device of claim 13, wherein an upper surface of the first top electrode facing away from the substrate is level with an upper surface of the first dielectric layer facing away from the substrate, and wherein an upper surface of the second top electrode facing away from the substrate extends further from the substrate than the upper surface of the first dielectric layer.

16. The semiconductor device of claim 11, wherein the first top electrode and the first bottom electrode have a same width.

17. A semiconductor device comprising:
a substrate;
a first dielectric layer over the substrate and extending from a first device region of the semiconductor device to a second device region of the semiconductor device;
a memory cell over the substrate in the first device region, wherein the memory cell comprises a first ferroelectric structure in the first dielectric layer, wherein the first ferroelectric structure comprises a first top electrode, a first bottom electrode, and a first ferroelectric layer between the first top electrode and the first bottom electrode, wherein the first top electrode and the first bottom electrode have a same width; and
a tunable capacitor over the substrate in the second device region, wherein the tunable capacitor comprises a second ferroelectric structure in the first dielectric layer, wherein the second ferroelectric structure comprises a second top electrode, a second bottom electrode, and a second ferroelectric layer between the second top electrode and the second bottom electrode, wherein the second bottom electrode is wider than the second top electrode.

18. The semiconductor device of claim 17, further comprising:
a first conductive feature coupled to an upper surface of the second top electrode of the second ferroelectric structure;
a second conductive feature coupled to an upper surface of the second bottom electrode of the second ferroelectric structure; and
a third conductive feature coupled to a lower surface of the second bottom electrode of the second ferroelectric structure.

19. The semiconductor device of claim 18, wherein the first conductive feature is configured be coupled to a voltage supply during an initialization state of the tunable capacitor, and is configured to be coupled to a radio frequency (RF) circuit during a normal operation state of the tunable capacitor, wherein the second conductive feature is configured to be coupled to a modulation voltage supply for fine tuning a capacitance of the tunable capacitor during the normal operation state.

20. The semiconductor device of claim 17, wherein the second bottom electrode has a hollow cylinder shape and extends into the first dielectric layer, wherein a center portion of the second top electrode has a cylinder shape and extends into the hollow cylinder shaped second bottom electrode, wherein the second ferroelectric layer surrounds the center portion of the second top electrode and fills a space between the second bottom electrode and the second top electrode.

* * * * *

UNITED STATES PATENT AND TRADEMARK OFFICE
CERTIFICATE OF CORRECTION

| | | |
|---|---|---|
| PATENT NO. | : 11,527,542 B2 | Page 1 of 1 |
| APPLICATION NO. | : 16/904717 | |
| DATED | : December 13, 2022 | |
| INVENTOR(S) | : Sai-Hooi Yeong et al. | |

It is certified that error appears in the above-identified patent and that said Letters Patent is hereby corrected as shown below:

In the Claims

Claim 6, Column 15, Line 13; delete "device of claim 4" and insert --device of claim 5--.

Signed and Sealed this
Tenth Day of January, 2023

Katherine Kelly Vidal
*Director of the United States Patent and Trademark Office*